US008135375B2

(12) United States Patent
Brekelmans (10) Patent No.: US 8,135,375 B2
(45) Date of Patent: Mar. 13, 2012

(54) RECEIVER HAVING A GAIN-CONTROLLABLE STAGE

(75) Inventor: Johannes Hubertus Antonius Brekelmans, Nederweert (NL)

(73) Assignee: NXP B.V., Eindhoven (NL)

( * ) Notice: Subject to any disclaimer, the term of this patent is extended or adjusted under 35 U.S.C. 154(b) by 703 days.

(21) Appl. No.: 12/065,315

(22) PCT Filed: Aug. 23, 2006

(86) PCT No.: PCT/IB2006/052912
§ 371 (c)(1),
(2), (4) Date: Feb. 29, 2008

(87) PCT Pub. No.: WO2007/026278
PCT Pub. Date: Mar. 8, 2007

(65) Prior Publication Data
US 2008/0248757 A1    Oct. 9, 2008

(30) Foreign Application Priority Data
Sep. 2, 2005  (EP) .................................... 05108093

(51) Int. Cl.
H04B 1/16    (2006.01)
(52) U.S. Cl. ........ 455/340; 455/341; 455/311; 455/307; 455/291; 455/293; 455/241.1; 455/240.1; 455/282
(58) Field of Classification Search .... 455/234.1–236.1, 455/240.1–243.1, 245.1–252.1, 296, 307, 455/311, 335, 281–283, 291–293, 339–341
See application file for complete search history.

(56) References Cited

U.S. PATENT DOCUMENTS

| 5,179,730 | A  | * | 1/1993  | Loper ............................ 455/266 |
| 5,561,395 | A  | * | 10/1996 | Melton et al. ...................... 330/2 |
| 5,640,697 | A  | * | 6/1997  | Orndorff ........................ 455/315 |
| 5,903,854 | A  | * | 5/1999  | Abe et al. ....................... 455/575.1 |
| 6,151,488 | A  | * | 11/2000 | Brekelmans ................ 455/150.1 |
| 6,272,330 | B1 | * | 8/2001  | Speake .......................... 455/341 |
| 6,721,368 | B1 |   | 4/2004  | Younis et al. |
| 6,724,440 | B1 | * | 4/2004  | Suan et al. ....................... 348/731 |
| 6,804,500 | B2 | * | 10/2004 | Yamaguchi .................... 455/127.1 |
| 7,263,342 | B2 | * | 8/2007  | Bagheri et al. ................. 455/283 |
| 7,579,912 | B2 | * | 8/2009  | Fanous et al. .................. 330/254 |

FOREIGN PATENT DOCUMENTS

| CN | 1461522 A     | 12/2003 |
| EP | 1 355 419 A2  | 10/2003 |
| GB | 2070872 A     | 9/1981  |
| JP | 2004-023532 A | 1/2004  |
| WO | 9946855 A2    | 9/1999  |

* cited by examiner

Primary Examiner — Edward Urban
Assistant Examiner — Rui Hu (57) ABSTRACT

A gain-controllable stage (CLN, A1, A2 . . . , A7, ACC) comprises a reactive signal divider (CLN) followed by an amplifier arrangement (A1, A2 . . . , A7, ACC). The reactive signal divider (CLN) may be in the form of, for example, a capacitive ladder network. The gain-controllable stage (CLN, A1, A2 . . . , A7, ACC) has a gain factor that depends on a signal division factor that the reactive signal divider (CLN) provides. The reactive signal divider (CLN) forms part of a filter (LC). The signal division factor is adjusted on the basis of a frequency (F) to which the receiver is tuned and a signal-strength indication (RS).

10 Claims, 6 Drawing Sheets

| C12 | 5 pF |
|---|---|
| C23 | 2 pF |
| C34 | 3 pF |
| C45 | 2 pF |
| C56 | 2 pF |
| C67 | 2 pF |

| C20 | 0.1 pF |
|---|---|
| C30 | 0.1 pF |
| C40 | 0.1 pF |
| C50 | 4 pF |
| C60 | 4 pF |
| C70 | 4 pF |

| F(MHz) | 401 | 453 | 510 | 572 | 640 | 713 | 790 | 872 |
|---|---|---|---|---|---|---|---|---|
| V1 | 4.028 | 4.540 | 5.100 | 5.730 | 6.400 | 7.125 | 7.903 | 8.707 |
| V2 | 3.460 | 3.897 | 4.381 | 4.922 | 5.497 | 6.120 | 6.788 | 7.479 |
| V3 | 2.212 | 2.491 | 2.801 | 3.147 | 3.515 | 3.913 | 4.340 | 4.782 |
| V4 | 1.454 | 1.638 | 1.840 | 2.067 | 2.308 | 2.570 | 2.851 | 3.141 |
| V5 | 0.390 | 0.439 | 0.505 | 0.568 | 0.634 | 0.706 | 0.783 | 0.863 |
| V6 | 0.109 | 0.123 | 0.138 | 0.155 | 0.173 | 0.706 | 0.214 | 0.235 |
| V7 | 0.035 | 0.040 | 0.045 | 0.050 | 0.056 | 0.706 | 0.070 | 0.077 |

RECEIVER HAVING A GAIN-CONTROLLABLE STAGE

FIELD OF THE INVENTION

An aspect of the invention relates to a receiver that has a gain-controllable stage. The receiver may be, for example, a television receiver that derives video, audio, and other data, from a selected channel in a radiofrequency spectrum. In such a receiver, a gain-controllable stage typically brings the radiofrequency spectrum at an appropriate signal level for further processing. Other aspects of the invention relate to a method of controlling a receiver, a computer program product for a receiver, and an information-rendering system.

DESCRIPTION OF PRIOR ART

U.S. Pat. No. 6,272,330 describes a gain controlled radio receiver for a selective call system. The receiver includes a multi-step gain controlled radiofrequency amplifier with various gain stages whose outputs are coupled to a common output stage. A capacitive ladder attenuator is coupled to an input terminal and has various outputs coupled respectively to an input of each gain stage, except for one gain stage, which is coupled to the input terminal. A measuring circuit, which measures the level of a wanted frequency down converted signal, selectively switches on one of the gain stages.

SUMMARY OF THE INVENTION

It is an object of the invention to provide an improved receiver. The invention is defined by the independent claims. The dependent claims define advantageous embodiments.

According to an aspect of the invention, a gain-controllable stage comprises a reactive signal divider followed by an amplifier arrangement. The gain-controllable stage has a gain factor that depends on a signal division factor that the reactive signal divider provides. The reactive signal divider forms part of a filter. A controller adjusts the signal division factor on the basis of a frequency to which the receiver is tuned and a signal-strength indication. The reactive signal divider may be a capacitive signal divider or an inductive signal divider, or a combination of those.

The invention takes the following aspects into consideration. A receiver may have to operate under various different reception conditions. For example, a receiver may receive a radiofrequency spectrum that comprises a relatively weak desired signal and other signals, which are of moderate strength. Under such a weak signal reception condition, any receiver noise will degrade a signal-to-noise ratio that is already low because of the relatively weak desired signal. As another example, a radiofrequency spectrum may also comprise a relatively strong desired signal. Under such a strong signal reception condition, the relatively strong desired signal may overload one or more circuits within the receiver, which causes distortion. Yet another example is that of a radiofrequency spectrum that comprises a relatively weak desired signal in the presence of other signals that are relatively strong. Under such a weak-with-strong signal reception condition, the relatively strong signals may generate spurious signals, such as intermodulation products, which are due to circuit nonlinearities in the receiver. These spurious signals may interfere with the relatively weak desired signal.

A receiver may comprise a gain-controllable stage in order to cope with various different reception conditions. The gain-controllable stage preferably provides a relatively high gain under weak signal reception conditions. This prevents other stages, which are after the gain-controllable stage, from deteriorating the signal-to-noise ratio. The gain-controllable stage preferably provides a relatively low gain under strong signal reception conditions. This prevents overload of the other stages, which are after the gain-controllable stage. Gain control is a compromise under weak-with-strong reception conditions. The higher the gain of the gain-controllable stage is, the stronger the spurious signals will be, which may interfere with the relatively weak desired signal. Conversely, the lower the gain of the gain-controllable stage is, the greater the extent to which other stages, which are after the gain-controllable stage, will deteriorate the signal-to-noise ratio.

A filter, which is placed in front of the gain-controllable stage, allows better reception quality under weak-with-strong signal reception conditions. The filter is preferably tuned so that the filter passes the relatively weak desired signal and attenuates the relatively strong signals that may potentially cause spurious signals. However, the filter may adversely affect reception quality under weak signal reception conditions for the following reasons. The gain-controllable stage, which inevitably produces noise, determines the signal-to-noise ratio to a considerable extent under weak signal reception conditions. The amount of noise, which the gain-controllable stage produces, depends on a source impedance that is associated with an input signal, which the gain-controllable stage receives. The amount of noise is minimal for a specific source impedance and, consequently, is higher for any other source impedance. A filter, which is placed in front of the gain-controllable stage, may cause the source impedance to vary throughout a frequency band of interest, in particular when the filter is tuned. Accordingly, minimal noise can be achieved in a relatively small portion of the frequency band only. That is, the filter may cause the gain-controllable stage to produce more noise throughout a relatively large portion of the frequency band. This will deteriorate the signal-to-noise ratio to a considerable extent.

In accordance with the aforementioned aspect of the invention, a reactive signal divider forms part of a filter. A controller adjusts a signal division factor that the reactive signal divider provides, on the basis of a frequency to which the receiver is tuned and a signal-strength indication.

Accordingly, the reactive signal divider can be used for two different purposes. Firstly, the reactive signal divider can be used as a signal attenuator, which allows a gain control that avoids overload and excessive intermodulation. In addition, the reactive signal divider can be used as an impedance transformer, which is coupled to an amplifier arrangement that forms part of the gain-controllable stage. The reactive signal divider provides an impedance transformation that depends on the signal division factor, which the reactive signal divider provides. This impedance transformation allows a source impedance for the amplifier arrangement that is relatively close to the specific source impedance for which the amplifier arrangement generates minimal noise. That is, the reactive signal divider is used for noise matching, which is a term that designates an impedance transformation for the purpose of minimal noise. The noise matching is frequency-dependent because the signal division factor is adjusted on the basis of the frequency to which the receiver is tuned. This allows the gain-controllable stage to produce relatively little noise throughout a frequency band of interest. Accordingly, the filter can improve quality of reception under weak-with-strong signal reception conditions, as explained hereinbefore, without a substantial penalty on quality of reception under weak signal reception conditions. For those reasons, the invention allows better quality of reception.

Another advantage of the invention relates to the following aspects. In principle, it is possible to design a filter, which is placed before a gain-controllable stage, that provides a substantially constant source impedance throughout a frequency band of interest, even when the filter is tuned. Such a constant impedance filter would allow a relatively low noise throughout the frequency band of interest for the reasons explained hereinbefore. However, such a constant impedance filter will generally be relatively complex and, therefore, relatively costly. The invention does not require complicated filter structures. The filter of which the reactive signal divider forms part may be, for example, a simple resonance circuit. For those reasons, the invention allows cost-efficient implementations.

These and other aspects of the invention will be described in greater detail hereinafter with reference to drawings.

DETAILED DESCRIPTION

Figure 1:
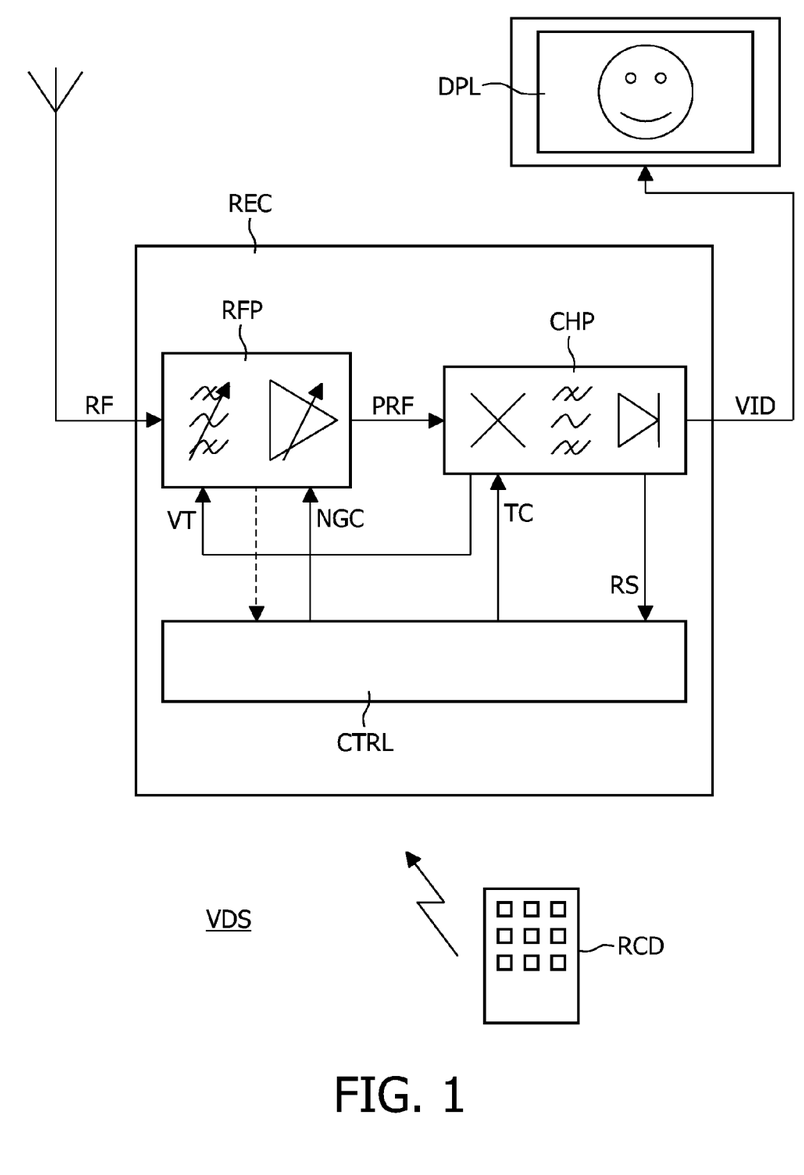
FIG. 1 is a block diagram that illustrates an embodiment of a video display set.

FIG. 1 illustrates an embodiment of a video display set VDS. The video display set VDS comprises a receiver REC, a display device DPL, and a remote control device RCD. The receiver REC may be in the form of, for example, a television set, a settop box, a digital video recorder, or any combination of those. The display device DPL may be, for example, a flat panel display with loudspeakers. The display device DPL and the receiver REC may form one apparatus or may be separate entities.

The receiver REC receives a radiofrequency spectrum RF that comprises various channels. Each channel has a different frequency. A user can select a particular channel by means of, for example, the remote control device RCD. The particular channel, which the user has selected, will be referred to as selected channel hereinafter. The receiver REC derives a video signal VID from the selected channel. The display device DPL displays the video signal VID.

The receiver REC comprises the following functional entities: a radiofrequency processor RFP, a channel processor CHP, and a controller CTRL. The radiofrequency processor RFP may form part of, for example, a tuner module that has a tin can housing. Such a tuner module may further comprise one or more circuits that functionally belong to the channel processor CHP. The radiofrequency processor RFP and the channel processor CHP may form part of a single board, which can be plugged into a personal computer or any other multimedia device. The controller CTRL may be in the form of a suitably programmed microprocessor.

The receiver REC basically operates as follows. The radiofrequency processor RFP filters the radiofrequency spectrum RF. The radiofrequency processor RFP has a pass band within the radiofrequency spectrum RF. The pass band depends on a tuning voltage VT that the radiofrequency processor RFP receives. The tuning voltage VT causes the pass band of the radiofrequency processor RFP to substantially coincide with the selected channel. Consequently, the radiofrequency processor RFP attenuates channels other than the selected channel. In particular, channels that are relatively remote from the selected channel are attenuated to a relatively great extent.

The radiofrequency processor RFP equally amplifies the radiofrequency spectrum RF. The radiofrequency processor RFP provides a gain that depends on a noise-and-gain control signal NGC. Accordingly, the radiofrequency processor RFP provides a processed radiofrequency spectrum PRF, which is a filtered and amplified version of the radiofrequency spectrum RF that the receiver REC receives.

The channel processor CHP, which receives the processed radiofrequency spectrum PRF, suppresses any signals that are outside the selected channel. To that end, the channel processor CHP may comprise a frequency converter followed by a channel selection filter, which has a relatively narrow pass band. The frequency converter carries out a frequency shift so that the selected channel, when frequency shifted, coincides with the relatively narrow pass band of the channel selection filter. The frequency shift depends on the selected channel. The frequency converter may comprise, for example, a frequency synthesizer that adjusts the frequency shift in dependence on a tuning command TC. A demodulator derives a baseband signal from a frequency-shifted version of a signal within the selected channel, which has passed the channel selection filter. The baseband signal may undergo further processing, which may include, for example, channel decoding, error correction, and baseband decoding, such as, for example, MPEG 2 decoding. The video signal VID results from this processing.

Let it be assumed that the user selects a particular channel by means of the remote control device RCD. The remote control device RCD sends a command to the controller CTRL that indicates the selected channel. In response, the controller CTRL generates the tuning command TC that corresponds with the selected channel. As explained hereinbefore, the tuning command TC will tune the channel processor CHP, as it were, to the selected channel. In this tuning process, the channel processor CHP may generate the tuning voltage VT for the radiofrequency processor RFP. For example, the tuning voltage VT may be derived from a tuning voltage VT within the frequency synthesizer, which may form part of the channel processor CHP as mentioned hereinbefore.

The controller CTRL establishes the noise-and-gain control signal NGC for the radiofrequency processor RFP on the basis of the frequency of the selected channel and signal strength conditions. The controller CTRL knows the frequency because the controller CTRL typically comprises a list of channels with a frequency indication for each channel. The controller CTRL uses the frequency indication for the selected channel to generate the tuning command TC for the channel processor CHP and to display the frequency, if so requested. The controller CTRL may know the signal strength conditions on the basis of, for example, a signal-strength indication RS that the channel processor CHP provides. FIG. 1 illustrates this. This signal-strength indication RS may relate to, for example, a signal within the selected channel. The controller CTRL may receive a further signal-strength indication from the radiofrequency processor RFP. FIG. 1 illustrates this by means of a broken line.

Reception quality depends to a considerable extent on the radiofrequency processor RFP. Let it be assumed that the selected channel comprises a relatively weak signal, which has a relatively poor signal-to-noise ratio. The radiofrequency processor RFP should have low noise to prevent signal-to-noise ratio degradation. What is more, the gain of the radiofrequency processor RFP should be sufficiently high so as to prevent noise that the channel processor CHP inevitably produces, from further degrading the signal-to-noise ratio. The radiofrequency processor RFP will apply an amplified version of the relatively weak signal to the channel processor CHP. The gain should be sufficiently high so that the amplified version is well above the noise of the channel processor CHP.

Let it now be assumed that the selected channel comprises a relatively strong signal, which has a relatively good signal-to-noise ratio. In that case, the gain of the radiofrequency processor RFP is an important parameter, whereas the noise is of lesser importance. The gain should be relatively low so as to avoid an overload of the channel processor CHP, which can only handle signals up to a certain level. Distortion will occur if the channel processor CHP receives an input signal that is above a critical level. The gain of the radiofrequency processor RFP should preferably be controlled so that the input signal of the channel processor CHP remains below the critical level.

Figure 2:
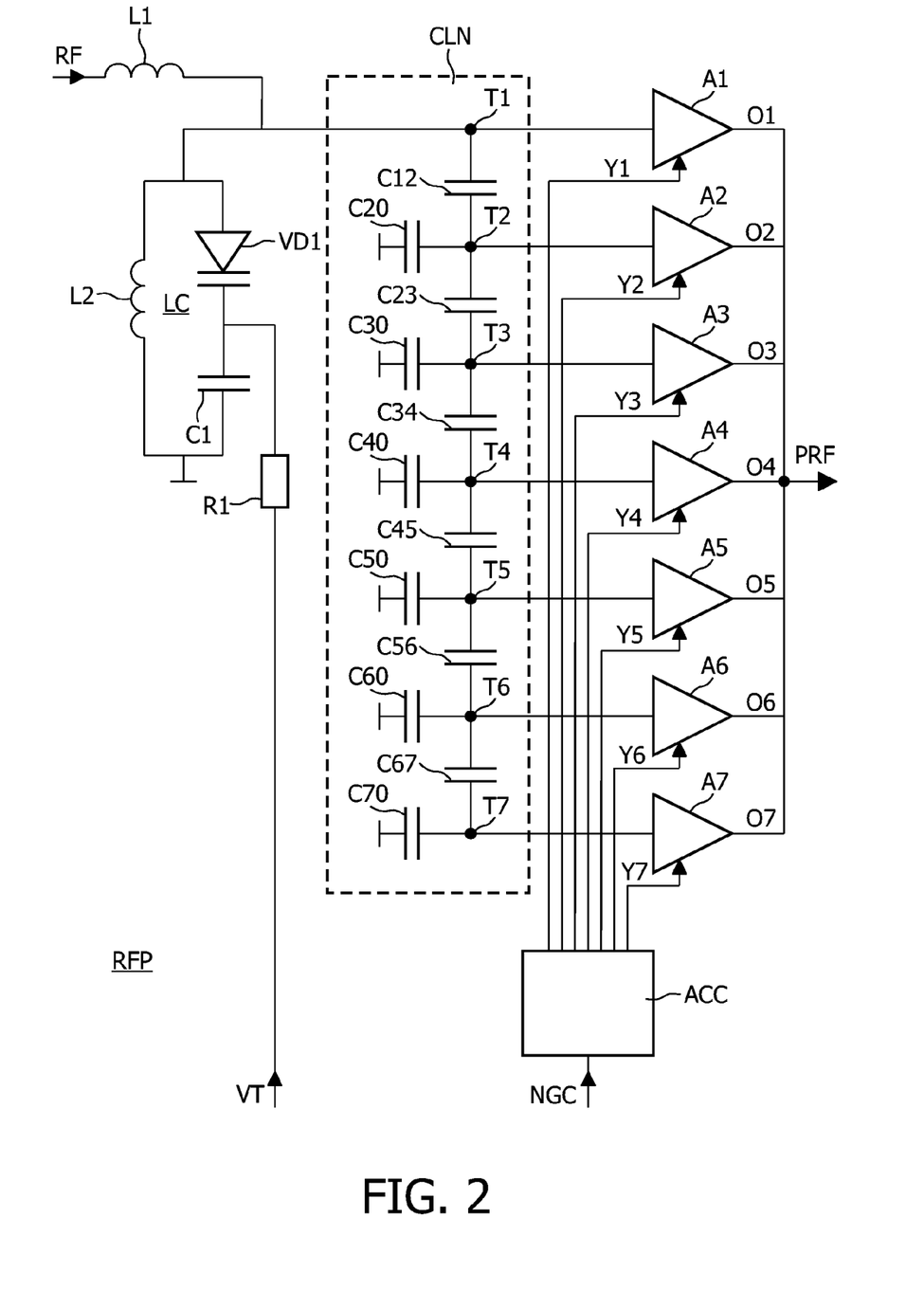
FIG. 2 is a block diagram that illustrates an embodiment of a radiofrequency processor, which forms part of the video display set.

FIG. 2 illustrates an embodiment of the radiofrequency processor RFP. The radiofrequency processor RFP comprises two inductances L1, L2, a varactor diode VD1, a resistance R1, thirteen capacitances C1, C12, C20, C23, C30, C34, C40, C45, C50, C56, C60, C67, C70, seven readout amplifiers A1, A2, ..., A7, and an amplifier control circuit ACC. Capacitances C12, C20, C23, C30, C34, C40, C45, C50, C56, C60, C67, C70 form a capacitive ladder network CLN with seven taps T1, T2, ..., T7. A readout amplifier is coupled to each tap of the capacitive ladder network CLN. Inductance L2, varactor diode VD1, and capacitance C1 form a tunable resonance circuit LC. The capacitive ladder network CLN also forms part of the tunable resonance circuit LC. Inductance L1 is coupled between an input of the radiofrequency processor RFP, on which the radiofrequency spectrum RF is present, and the tunable resonance circuit LC.

The radiofrequency processor RFP operates as follows. The tunable resonance circuit LC has a resonance frequency that varies as a function of the tuning voltage VT. The tuning voltage VT is adjusted so that the resonance frequency coincides with the selected channel. Accordingly, the tunable resonance circuit LC constitutes a band pass filter that is tuned to the selected channel. Channels other than the selected channel are attenuated. The tunable resonance circuit LC constitutes a real impedance at the resonance frequency. This real impedance will be referred to as resonance impedance hereinafter. The resonance impedance has a magnitude that varies with the resonance frequency in accordance with a substantially square function. This is because the tunable resonance circuit LC preferably has a bandwidth that is substantially constant throughout the frequency band of interest. For example, let it be assumed that the resonance impedance is 248 Ohms when the resonance frequency is 450 Megahertz (MHz). In that case, the resonance impedance is typically 992 Ohms at 900 MHz.

Inductance L1 provides an impedance transformation between the input of the radiofrequency processor RFP and the tunable resonance circuit LC. This impedance transformation allows the radiofrequency processor RFP to have an input impedance that is substantially independent of the resonance impedance. The input impedance is substantially constant; 75 Ohms is a typical value. This allows a satisfactory impedance matching between the receiver REC and an electrical entity from which the receiver REC receives the radiofrequency spectrum RF. Such an electrical entity may be, for example, an antenna or a cable network.

Inductance L1 and the tunable resonance circuit LC form an input signal voltage scaling circuit, which multiplies a signal voltage that is present at the input of the radiofrequency processor RFP by an input signal voltage scaling factor. The input signal voltage scaling factor is a product of a voltage-to-current conversion, which inductance L1 carries out, and a current-to-voltage conversion, which the tunable resonance circuit LC carries out. The voltage-to-current conversion, which inductance L1 carries out, has a magnitude that decreases substantially proportionally with the resonance frequency. The current-to-voltage conversion, which the tunable resonance circuit LC carries out, corresponds with the resonance impedance. It has been mentioned hereinbefore that the resonance impedance has a magnitude that varies with the resonance frequency in accordance with a substantially square function. Consequently, the input signal voltage scaling factor increases substantially proportionally with the frequency of selected channel. For example, the input signal voltage scaling factor may be 4.5 at 450 MHz and may be 9.0 at 900 MHz. The capacitive ladder network CLN provides a signal voltage division between the tunable resonance circuit LC and each respective readout amplifier A1, A2, ..., A7. Each respective signal voltage division constitutes a lossless signal attenuation. Readout amplifier A1, which is coupled to tap T1, receives a signal voltage that is present on the tunable resonance circuit LC. There is no signal attenuation. Readout amplifier A2, which is coupled to tap T2, receives a weaker signal voltage. Readout amplifier A2 receives a signal voltage that is equal to the signal voltage at the tunable resonance circuit LC divided by a factor which depends on capacitance C12 and the other capacitances that form part of the capacitive ladder network CLN. Readout amplifier A3, which is coupled to tap T3, receives a yet weaker signal voltage. Readout amplifier A3 receives a signal voltage that is equal to the signal voltage at the tunable resonance circuit LC divided by a factor which depends on capacitance C12, C20, C23 and the other capacitances that form part of the capacitive ladder network CLN. Accordingly, each tap provides a different signal voltage division factor. The signal voltage that a readout amplifier receives is equal to the signal voltage at the tunable resonance circuit LC divided by the signal voltage division factor at the tap to which the readout amplifier is coupled.

The capacitive ladder network CLN further provides an impedance transformation between the tunable resonance circuit LC and each respective readout amplifier A1, A2, ..., A7. Readout amplifier A1 is coupled to tap T1, which has an impedance at the resonance frequency that is equal to the resonance impedance. Readout amplifier A2 is coupled to tap T2, which has a lower impedance. Tap T2 has an impedance at the resonance frequency that is equal to the resonance impedance divided by a factor, which depends on capacitance C12 and the other capacitances that form part of the capacitive ladder network CLN. Readout amplifier A3 is coupled to tap T3, which has a yet lower impedance. Tap T3 has impedance at the resonance frequency that is equal to the resonance impedance divided by a factor, which depends on capacitances C12, C20, C23 and the other capacitances that form part of the capacitive ladder network CLN. Accordingly, each tap provides a different impedance division factor. The impedance at a tap is equal to the resonance impedance divided by the impedance division factor for that tap.

The impedance transformation, which the capacitive ladder network CLN provides, is related to noise performance. Each readout amplifier has a noise performance that depends to a considerable extent on a source impedance to which the readout amplifier is coupled. The noise performance is optimal for a specific source impedance and will degrade for source impedances that have lower or higher values. The source impedance that a readout amplifier sees, as it were, is the impedance at the tap to which the reader amplifier is coupled. The capacitive ladder network CLN causes each readout amplifier to see a different source impedance.

There will be one tap whose impedance is closest to the impedance that is optimal for noise performance. The tap that satisfies this criterion will be called optimal noise tap hereinafter. The optimal noise tap depends on the resonance impedance. This is because the resonance impedance varies as a function of the resonance frequency, which coincides with the frequency of the selected channel. Consequently, the optimal noise tap depends on the frequency of the selected channel.

Figure 3:
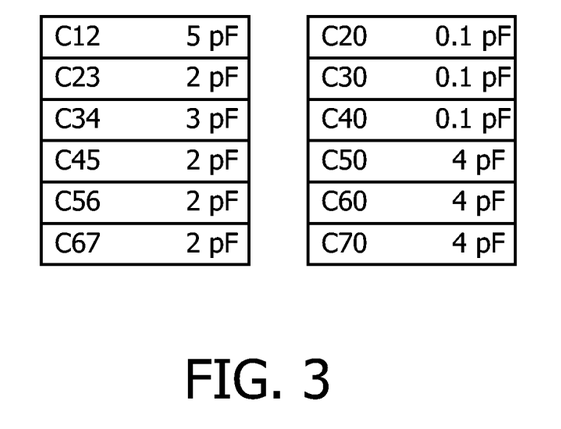
FIG. 3 is a listing of appropriate capacitance values for a capacitive ladder network, which forms part of the radiofrequency processor.

FIG. 3 illustrates exemplary capacitance values for the capacitive ladder network CLN that allow satisfactory performance in terms of noise and gain. FIG. 3 comprises two lists: a left-hand list and a right-hand list. The left-hand list specifies values for capacitances C12, C23, C34, C45 C56, C67, which are coupled between two adjacent taps of the capacitive ladder network CLN. The right-hand list specifies values for capacitances C20, C30, C40, C50, C60, C70, which are coupled to signal ground.

Capacitances C20, C30, C40, which couple taps T2, T3, T4 to signal ground, respectively, have relatively small values. Capacitances C50, C60, C70, which couple taps T5, T6, T7 to signal ground, respectively, have relatively large values. Consequently, the respective signal voltage division factors that taps T1, T2, T3, T4 provide are relatively closely spaced, as it were, whereas the respective signal voltage division factors that taps T4, T5, T6, T7 provide are relatively widely spaced. This allows satisfactory control in terms of noise and gain. One of the respective impedances at taps T1, T2, T3, T4 will be relatively close to the specific source impedance for which the noise performance is optimal, as explained hereinbefore. That is, taps T1, T2, T3, T4 form a set of taps primarily intended for noise performance optimization. Taps T4, T5, T6, T7 form another set of taps primarily intended for gain adjustment.

The seven readout amplifiers A1, A2, . . . , A7 of FIG. 2 will now be described in greater detail. Readout amplifier A1 provides an output signal O1 that is a scaled version of the signal voltage that is present at tap T1 to which readout amplifier A1 is coupled. That is, readout amplifier A1 scales the signal voltage at tap T1 with a scaling factor. Similarly, readout amplifiers A2, . . . , A7 provide output signals O2, . . . , O7, which are scaled versions of the respective signal voltages that are present at taps T2, . . . , T7 to which readout amplifiers A2, . . . , A7 are coupled, respectively. Readout amplifiers A2, . . . , A7 scale the respective signal voltages with respective scaling factors.

The amplifier control circuit ACC applies biasing currents Y1, Y2, . . . , Y7 to the readout amplifiers A1, A2, . . . , A7, respectively. Biasing current Y1 determines the scaling factor that readout amplifier A1 provides. Similarly, biasing currents Y2, . . . , Y7 determines the respective scaling factors that readout amplifiers A2, . . . , A7 provide, respectively. The biasing currents Y1, Y2, . . . , Y7 that the amplifier control circuit ACC provides depends on the noise-and-gain control signal NGC. This will be explained in greater detail hereinafter.

The processed radiofrequency spectrum PRF is a sum of the output signals O1, O2, . . . , O7 that the readout amplifiers A1, A2, . . . , A7 provide. Consequently, the processed radiofrequency spectrum PRF is a linear combination of the respective signal voltages that are present at the respective taps T1, T2, . . . , T7 of the capacitive ladder network CLN. The respective scaling factors, which the respective readout amplifiers A1, A2, . . . , A7 provide, constitute weighting factors in this linear combination. That is, each tap contributes to the processed radiofrequency spectrum PRF in accordance with a weighting factor. The amplifier control circuit ACC determines these respective weighting factors on the basis of the noise-and-gain control signal NGC.

Figure 4:
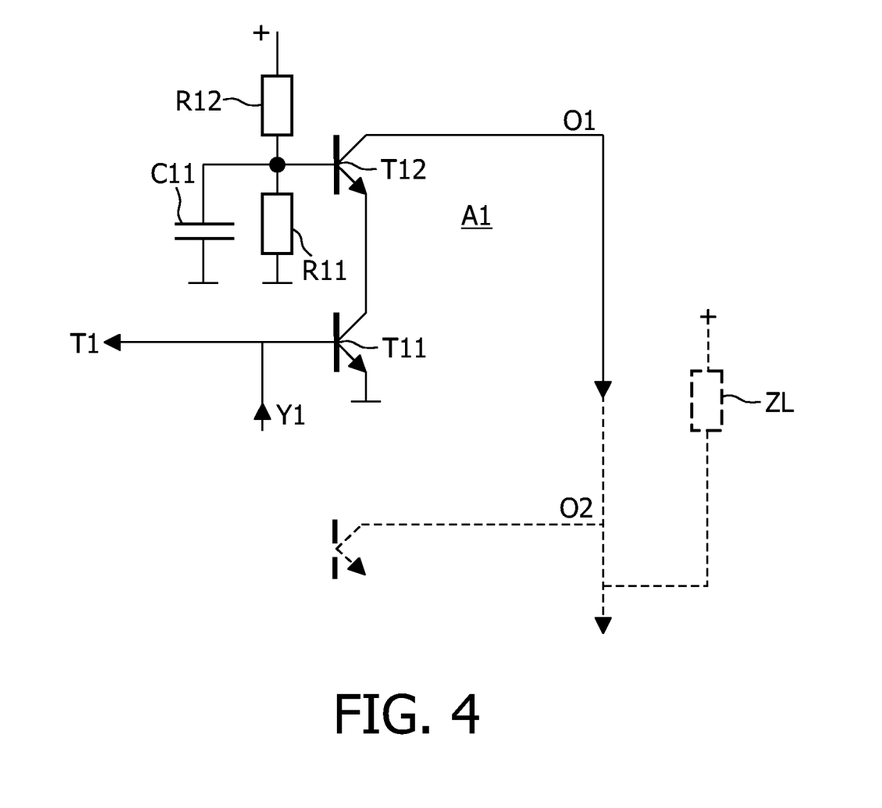
FIG. 4 is a circuit diagram that illustrates an embodiment of a readout amplifier, which forms part of the radiofrequency processor.

FIG. 4 illustrates an embodiment of readout amplifier A1. Readout amplifier A1 comprises two transistors T11, T12, two resistors R11, R12, and a capacitor C11. Transistor T11 has a base that is coupled to tap T1 of the capacitive ladder network CLN. Transistor T11 receives biasing current Y1 at the base. Transistor T12 has a common base configuration and constitutes a so-called cascode transistor. Transistor T12 has a base that is coupled to signal ground via the capacitor C11, which constitutes a decoupling capacitor. The two resistors R11, R12 apply a biasing voltage to the base of transistor. Output signal O1 is present at a collector of transistor, which is coupled to a common load impedance ZL for the seven readout amplifiers A1, A2, . . . , A7. FIG. 4 shows the common load impedance ZL in broken lines.

The readout amplifier A1 operates as follows. Biasing current Y1 determines a main current that flows through the two transistors T11, T12. Transistor T11 has a direct current amplification factor. The main current is substantially equal to biasing current Y1 multiplied by the direct current amplification factor of transistor T11. Transistor T11 converts the signal voltage that is present at tap T1 into a collector signal current. The collector signal current is equal to the signal voltage multiplied by a transconductance gain that transistor T11 provides. The transconductance gain varies proportionally with the main current and, consequently, the transconductance gain varies proportionally with biasing current Y1. The common load impedance ZL converts the collector signal current into output signal O1, which is a scaled version of the signal voltage at tap T1.

Readout amplifiers A2, . . . , A7 are similar to readout amplifier A1 and operate in a similar fashion. The respective collectors of the respective cascode transistors in the seven readout amplifiers A1, A2, . . . , A7 are coupled to each other and to the common load impedance ZL.

Figure 5:
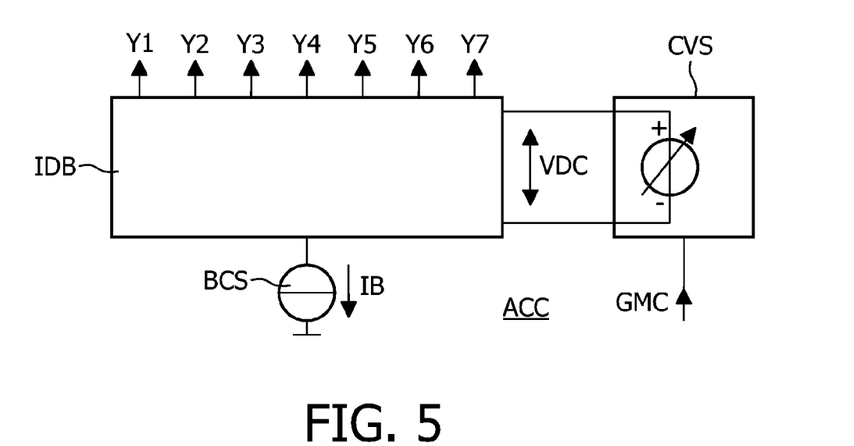
FIG. 5 is a block diagram that illustrates an embodiment of an amplifier control circuit, which forms part of the radiofrequency processor.

FIG. 5 illustrates an embodiment of the amplifier control circuit ACC. The amplifier control circuit ACC comprises a biasing current source BCS, a current distributor IDB, and a controllable voltage source CVS. The biasing current source BCS provides a basic biasing current IB. The current distributor IDB may comprise several differential transistor pairs, each of which constitutes an elementary current splitter. The controllable voltage source CVS may be in the form of, for example, a digital-to-analog converter.

The amplifier control circuit ACC operates as follows. The current distributor IDB splits the basic biasing current IB into seven different portions, which correspond with biasing currents Y1, Y2, . . . , Y7, respectively. The biasing currents Y1, Y2, . . . , Y7 thus result from a current partition of the basic biasing current IB. Accordingly, the sum of biasing currents Y1, Y2, . . . , Y7 is substantially equal to the basic biasing current IB. The current partition depends on a direct-current control voltage VDC, which the current distributor IDB receives from the controllable voltage source CVS. The noise-and-gain control signal NGC determines the direct-current control voltage VDC and, therefore, determines the current partition. The noise-and-gain control signal NGC may be, for example, a digital value. In that case, the controllable voltage source CVS converts the digital value into the direct-current control voltage VDC for the current distributor IDB.

Figure 6:
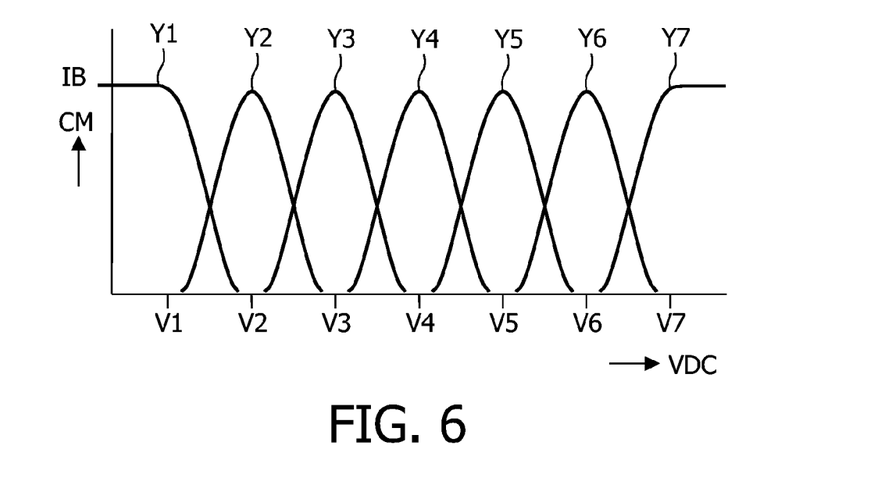
FIG. 6 is a graph that illustrates a biasing current partitioning, which the amplifier control circuit carries out.

FIG. 6 illustrates the current partition of the current distributor IDB, which depends on the direct-current control voltage VDC. FIG. 6 is a graph with a horizontal axis and a vertical axis. The horizontal axis represents the direct-current control voltage VDC. The horizontal axis indicates seven different values V1, V2, ..., V7 of the direct-current control voltage VDC. The vertical axis represents current magnitude CM. The graph comprises seven curves: one curve for each biasing current Y1, Y2, ..., Y7 that the amplifier control circuit ACC provides.

Let it be assumed that the direct-current control voltage VDC is below value V1. In that case, biasing current Y1 is substantially equal to the basic biasing current IB, whereas the other biasing currents Y1, Y2, ..., Y7 are substantially zero (0). Referring to FIG. 2, readout amplifier A1 is in an on state, whereas the other readout amplifiers A2, ..., A7 are substantially in an off state. The processed radiofrequency spectrum PRF is substantially derived from tap T1 of the capacitive ladder network CLN. Let it now be assumed that the direct-current control voltage VDC is equal to value V2. In that case, biasing current Y2 is substantially equal to the basic biasing current IB, whereas the other biasing currents Y1, Y3, ..., Y7 are substantially zero (0). Referring to FIG. 2, readout amplifier A2 is in an on state, whereas the other readout amplifiers A1, A3, ..., A7 are substantially in an off state. The processed radiofrequency spectrum PRF is substantially derived from tap T2 of the capacitive ladder network CLN. For similar reasons, the processed radiofrequency spectrum PRF is substantially derived from taps T3, T4, T5, T6 of the capacitive ladder network CLN if the direct-current control voltage VDC is equal to values V3, V4, V5, V6, respectively. The processed radiofrequency spectrum PRF is substantially derived from tap T7 of the capacitive ladder network CLN if the direct-current control voltage VDC is above value V7.

FIG. 6 illustrates that the processed radiofrequency spectrum PRF may partially be derived from one tap and partially from another tap, which is adjacent. For example, let it be assumed that the direct-current control voltage VDC is half way between value V1 and value V2. In that case, readout amplifier A1 and readout amplifier A2 provide a similar scaling factor. The respective scaling factors of the other readout amplifiers A3 ..., A7 are substantially equal to zero (0). The processed radiofrequency spectrum PRF is a sum of the signal voltage at tap T1 multiplied by the scaling factor that readout amplifier A1 provides and the signal voltage at tap T2 multiplied by the scaling factor that readout amplifier A2 provides, which scaling factors are similar. For example, let it be assumed that unity gain is the maximum value that a scaling factor can have. In that case, the two aforementioned scaling factors may each be ½.

The gain of the radiofrequency processor RFP can be made to vary in a continuous fashion by varying the direct-current control voltage VDC. The gain will vary in a quasi-continuous fashion if the controllable voltage source CVS is in the form of a digital-to-analog converter. The radiofrequency processor RFP will have a maximum gain if the direct-current control voltage VDC is below value V1. Conversely, the radiofrequency processor RFP will have a minimum gain if the direct-current control voltage VDC is above value V7. The radiofrequency processor RFP can have any gain between the maximum gain and the minimum gain.

Let it be assumed, for example, that the readout amplifiers A1, A2, ..., A7 each provide a scaling factor that is equal to one (1) when biasing currents Y1, Y2, ..., Y7 are equal to the basic biasing current IB, respectively. In that case, the maximum gain of the radiofrequency processor RFP is equal to the input signal voltage scaling factor, which inductance L1 and the tunable resonance circuit LC provides, as explained hereinbefore. Let it further be assumed that the direct-current control voltage VDC is equal to value V2. In that case, the gain of the radiofrequency processor RFP is equal to the input signal voltage scaling factor divided by the signal voltage division factor that tap T2 provides. Let it now be assumed that the direct-current control voltage VDC is equal to value V3. In that case, the gain of the radiofrequency processor RFP is equal to the input signal voltage scaling factor divided by the signal voltage division factor that tap T3 provides. Similarly, the gain of the radiofrequency processor RFP is equal to the input signal voltage scaling factor divided by the signal voltage division factors that taps T4, T5, T6, T7 provide when the direct-current control voltage VDC is equal to values V4, V5, V6, V7, respectively.

Figure 7:
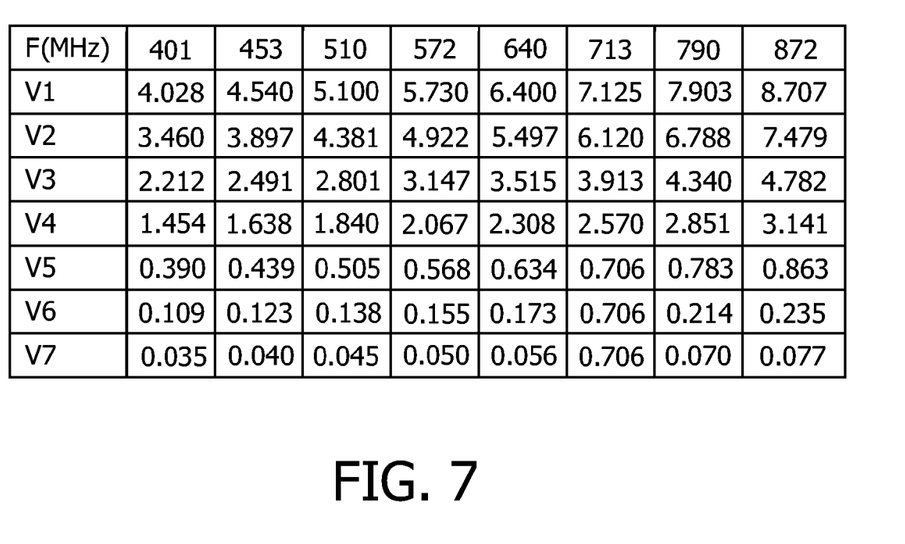
FIG. 7 is a table that illustrates gain characteristics of the radiofrequency processor.

FIG. 7 illustrates the gain of the radiofrequency processor RFP. The gain is represented in scalar units; the value "1" represents unity signal voltage gain. FIG. 7 is a table that comprises seven rows: one for each of the aforementioned values V1, V2, ..., V7 of the direct-current control voltage VDC. The table further comprises eight columns, each of which corresponds with a particular frequency: 401, 453, 510, 572, 640, 713, 790, and 872 MHz. The table specifies the gain of the radiofrequency processor RFP for each of the aforementioned values V1, V2, ..., V7 and for each of the aforementioned frequencies. The table applies when the capacitances of the capacitive ladder network CLN have the values that FIG. 3 specifies.

FIG. 7 illustrates that the gain for a particular value of the direct-current control voltage VDC increases with increasing frequency. This is because the input signal voltage scaling factor, which inductance L1 and the tunable resonance circuit LC provide, increases with increasing frequency. FIG. 7 further illustrates that the gain varies to a relatively small extent as a function of the direct-current control voltage VDC in a range comprised between values V1 and V4. Conversely, to relatively large extent the gain varies as a function of the direct-current control voltage VDC in a range comprises between values V4 and V7. This is due to the capacitance values that FIG. 3 specifies. The range comprised between values V1 and V4 is primarily intended for noise performance optimization under weak signal reception conditions and normal reception conditions. The range comprised between values V4 and V7 is primarily intended for gain adjustment under strong signal reception conditions and weak-with-strong signal reception conditions.

Figure 8:
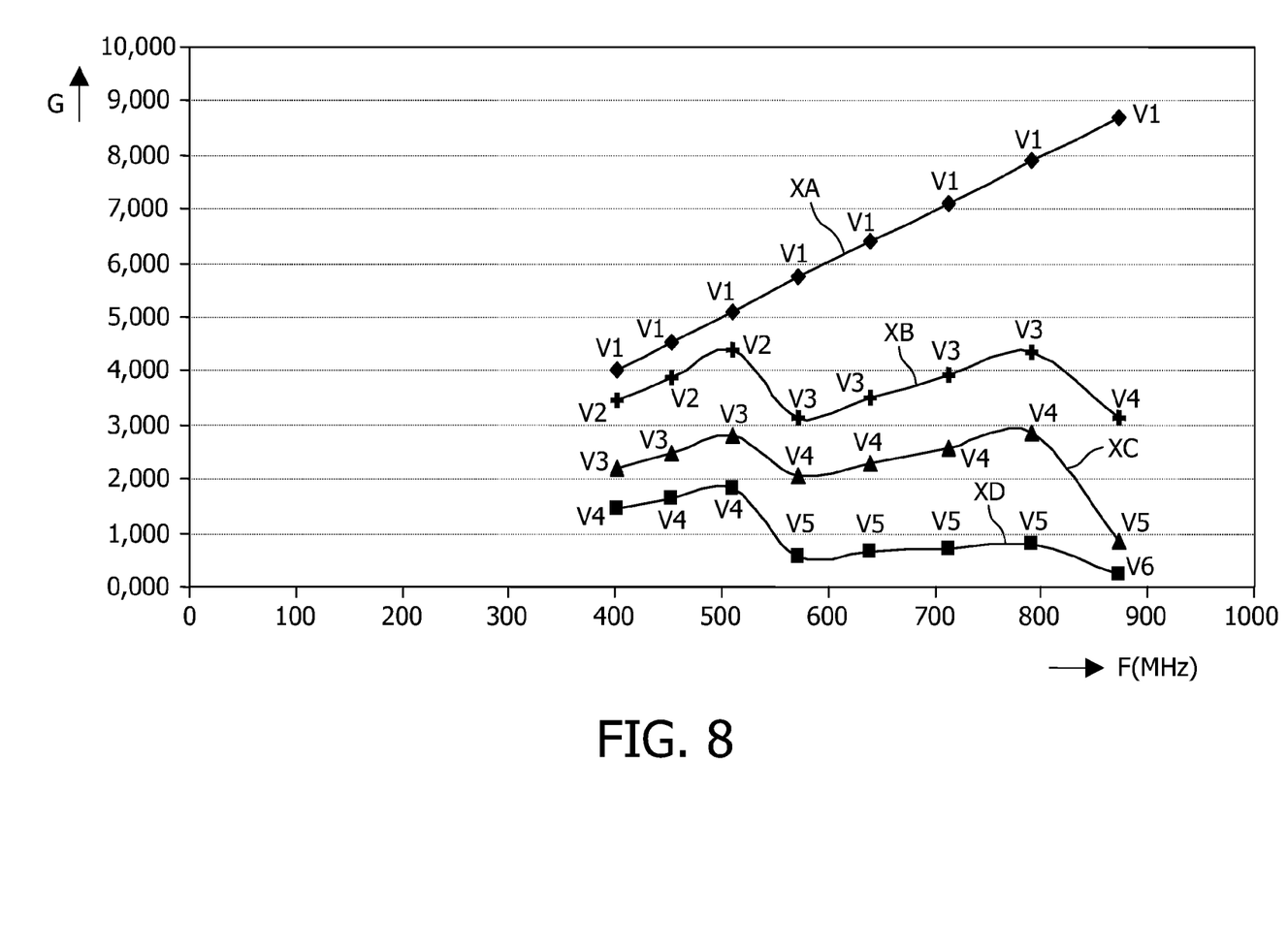
FIG. 8 is a graph that illustrates a gain control of the radiofrequency processor.

FIG. 8 illustrates a gain control. FIG. 8 is a graph with a horizontal axis and a vertical axis. The horizontal axis represents the frequency F of the selected channel in MHz units. The vertical axis represents the gain G of the radiofrequency processor RFP. The graph comprises four curves: XA, XB, XC, and XD. Each curve comprises various points. A point corresponds with a cell in the table that FIG. 7 represents. The frequency of the selected channel, which the horizontal axis represents, defines the column of the cell in the table. The value of the direct-current control voltage VDC defines the row of the cell. FIG. 8 specifies this value for each point in a curve. Curve XB, XC, and XD can be regarded as a high-gain control curve, a medium-gain control curve, and a low-gain control curve, respectively. FIG. 8 illustrates that the direct-current control voltage VDC needs to be adjusted if a substantially constant gain is required throughout a frequency band of interest, which is comprised between 401 MHz and 872 MHz in FIGS. 7 and 8.

It has been mentioned hereinbefore that the noise-and-gain control signal NGC, from which the direct-current control voltage VDC is derived, is established on the basis of the frequency of the selected channel and signal strength conditions. The noise-and-gain control signal NGC preferably has the following characteristics. The noise-and-gain control signal NGC causes the radiofrequency processor RFP, which FIG. 2 illustrates, to derive the processed radiofrequency spectrum PRF from the optimal noise tap under normal reception conditions. The optimal noise tap depends on the frequency of the selected channel as explained hereinbefore. Consequently, the noise-and-gain control signal NGC should preferably vary as a function of the frequency in a suitable manner under normal reception conditions, so as to achieve satisfactory noise performance. The noise-and-gain control signal NGC should control the gain so as to avoid overload and excessive intermodulation under strong signal reception conditions. The noise-and-gain control signal NGC should preferably vary as a function of the frequency in order to maintain a given constant gain throughout the frequency band of interest. FIG. 8 clearly illustrates this.

In the receiver REC of FIG. 1 the controller CTRL establishes the noise-and-gain control signal NGC. The controller CTRL may do so on the basis of, for example, a lookup table that specifies various values for the noise-and-gain control signal NGC for various different frequencies and for various different reception conditions. The lookup table may be stored in a nonvolatile memory. The controller CTRL may carry out interpolation functions and other mathematical functions so as to establish the noise-and-gain control signal NGC on the basis of the lookup table. These functions can be implemented by means of a set of instructions, i.e. software, loaded into a program memory of the controller CTRL.

Concluding Remarks

The detailed description hereinbefore with reference to the drawings illustrates the following characteristics, which are cited in various independent claims. A gain-controllable stage (CLN, A1, A2 . . . , A7, ACC) comprises a reactive signal divider (CLN) followed by an amplifier arrangement (A1, A2 . . . , A7, ACC). The gain-controllable stage (CLN, A1, A2 . . . , A7, ACC) has a gain factor that depends on a signal division factor that the reactive signal divider (CLN) provides. The reactive signal divider (CLN) forms part of a filter (LC). The signal division factor is adjusted on the basis of a frequency (F) to which the receiver is tuned and a signal-strength indication (RS).

The detailed description hereinbefore further illustrates various optional characteristics, which are cited in the dependent claims. These characteristics may be applied to advantage in combination with the aforementioned characteristics. Various optional characteristics are highlighted in the following paragraphs. Each paragraph corresponds with a particular dependent claim.

The reactive signal divider (CLN) comprises a capacitive ladder network having respective taps (T1, T2, . . . , T7) that provide respective signal division factors. The amplifier arrangement (A1, A2, . . . , A7, ACC) provides an output signal (PRF) that is substantially based on a signal from one of the respective taps (T1, T2, . . . , T7) depending on a control signal (NGC). The control signal (NGC) is based on the frequency (F) to which the receiver is tuned and the signal-strength indication (RS). This set of characteristics allows a relatively precise gain control with relatively little signal distortion and, therefore, further contributes to better quality of reception.

The capacitive ladder network comprises a set of taps (T1, T2, T3, T4) that provide respective signal division factors that differ to relatively small extent, and another set of taps (T4, T5, T6, T7) that provide respective signal division factors that differ to relatively large extent. This set of characteristics allows a relatively precise noise matching, which further contributes to better quality of reception.

The amplifier arrangement (A1, A2, . . . , A7, ACC) provides the output signal (PRF) in the form of a linear combination of respective signals at respective taps (T1, T2, . . . , T7) with weighting factors that depend on the control signal (NGC). This set of characteristics allows a continuous gain control, which further contributes to better quality of reception.

The amplifier arrangement (A1, A2 . . . , A7, ACC) comprises a plurality of readout amplifiers. Respective readout amplifiers receive respective input signals from respective taps (T1, T2, . . . , T7). The output signal (PRF) is a sum of respective output signals (O1, O2, . . . , O7) of respective readout amplifiers. A controllable current splitter (IDB, CVS) splits a basic bias current (IB) into various portions that constitute respective bias currents (Y1, Y2, . . . , Y7) for respective readout amplifiers. The split depends on the control signal (NGC) from the controller (CTRL). This set of characteristics allows cost-efficient implementations.

The filter (LC) comprises a tunable reactance (VD1) that is coupled in parallel with the reactive signal divider (CLN). This allows cost-efficient implementations. An inductance (L1) is coupled between an input of the receiver and the filter (LC). This allows the receiver to have a substantially constant input impedance, which further contributes to better quality of reception.

The aforementioned characteristics can be implemented in numerous different manners. In order to illustrate this, some alternatives are briefly indicated.

The reactive signal divider can be implemented in numerous different manners. The detailed description hereinbefore merely provides an example, in which a capacitive ladder network CLN forms the reactive signal divider. As another example, two capacitances, at least one of which is controllable, may form the reactive signal divider. There is only one tap in this case. A single readout amplifier is sufficient. The tap provides a signal division factor that depends on respective values of the one and the other capacitance that form the reactive signal divider. Yet another example is a combination of a capacitive ladder network and the two capacitances mentioned hereinbefore. Yet another example is a reactive signal divider that comprises an inductive ladder network in the form of, for example, a coil that has different taps. The reactive signal divider may have a differential structure.

There are numerous different manners to control the signal division factor in accordance with the invention. For example, an analog circuit may control the signal division factor, which the reactive signal divider provides. As an example, the receiver REC of FIG. 1 may be modified as follows. An analog control circuit is added. The analog control circuit receives the tuning voltage VT, which indicates the frequency of the selected channel, and the signal-strength indication RS. On the basis of these inputs, the analog control circuit generates the direct-current control voltage VDC for the current distributor IDB of FIG. 5. The controllable voltage source CVS may be dispensed with in this example. Such an analog control has a relatively fast response time, which may be advantageous when the receiver has to cope with relatively strong fading. An analog control may also be cheaper than a digital control.

The amplifier arrangement can be implemented in numerous different manners. For example, the radio frequency processor RFP of FIG. 2 may be modified as follows. A switching arrangement followed by a single amplifier replaces the seven readout amplifiers A1, A2, . . . , A7. The switching arrangement couples the single amplifier to one of taps depending on the noise-and-gain control signal NGC. A switching control circuit may replace the amplifier control circuit ACC. Alternatively, the controller CTRL illustrated in FIG. 1 may directly control the switching arrangement. As another example, the seven readout amplifiers A1, A2, . . . , A7 may be implemented by means of differential transistor pairs that provide respective gain factors, which constitute weighting factors, that vary as a function of one or more control voltages.

The signal-strength indication may take many different forms. For example, the signal-strength indication may relate to signal strength in the selected channel only. Preferably, the signal-strength indication indicates signal strength in the selected channel as well as signal strength in adjacent channels. This allows a gain control that avoids intermodulation. The signal-strength indication may further comprise wide band signal-strength indication, which indicates whether there are extremely strong signals outside the frequency band of interest, or not. Such extremely strong signals may cause overload.

There are numerous ways of implementing functions by means of items of hardware or software, or both. In this respect, the drawings are diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps. The mere fact that certain measures are recited in mutually different dependent claims does not indicate that a combination of these measures cannot be used to advantage.

The invention claimed is:

1. A receiver comprising:
    a gain-controllable stage that comprises a reactive signal divider followed by an amplifier arrangement, the gain-controllable stage having a gain factor that depends on a signal division ratio of the reactive signal divider;
    a filter, the reactive signal divider forming part of the filter; and
    a controller for adjusting the signal division ratio of the reactive signal divider on the basis of a frequency to which the receiver is tuned and a signal-strength indication.

2. A receiver according to claim 1, the reactive signal divider comprising a capacitive ladder network having respective taps that provide respective signal division ratios, the amplifier arrangement being arranged to provide an output signal that is substantially based on a signal from one of the respective taps depending on a control signal from the controller, the control signal being based on the frequency to which the receiver is tuned and the signal-strength indication.

3. A receiver according to claim 2, the capacitive ladder network comprising:
    a set of taps that provide respective signal division ratios that differ to relatively small extent; and
    another set of taps that provide respective signal division ratios that differ to relatively large extent.

4. A receiver according to claim 2, the amplifier arrangement being arranged provide the output signal in the form of a linear combination of respective signals at respective taps with weighting factors that depend on the control signal from the controller.

5. A receiver according to claim 4, the amplifier arrangement comprising:
    a plurality of readout amplifiers, respective readout amplifiers being coupled to receive respective input signals from respective taps of the capacitive ladder network, the output signal being a sum of respective output signals of respective readout amplifiers; and
    a controllable current splitter for splitting a basic bias current into various portions that constitute respective bias currents for respective readout amplifiers, the split depending on the control signal from the controller.

6. A receiver according to claim 1, the filter comprising a tunable reactance that is coupled in parallel with the reactive signal divider.

7. A receiver according to claim 6, comprising an inductance that is coupled between an input of the receiver and the filter.

8. An information-rendering system comprising:
    a receiver according to claim 1 for retrieving information from a received signal, and
    a rendering device for rendering the information.

9. A method of controlling a receiver that comprises:
    a gain-controllable stage that comprises a reactive signal divider followed by an amplifier arrangement the gain-controllable stage having a gain factor that depends on a signal division ratio of the reactive signal divider; and
    a filter, the reactive signal divider forming part of the filter;
    the method comprising:
    a noise-and-gain control step in which the signal division ratio of the reactive signal divider is adjusted on the basis of a frequency to which the receiver is tuned and a signal-strength indication.

10. A computer program for a receiver, the computer program comprising a set of instructions that, when loaded into the receiver, enable the receiver to carry out the method of claim 9.

* * * * *